US009401691B2

(12) United States Patent
Zou et al.

(10) Patent No.: US 9,401,691 B2
(45) Date of Patent: Jul. 26, 2016

(54) ACOUSTIC RESONATOR DEVICE WITH AIR-RING AND TEMPERATURE COMPENSATING LAYER

(71) Applicant: Avago Technologies General IP (Singapore) Pte. Ltd., Singapore (SG)

(72) Inventors: Qiang Zou, Fort Collins, CO (US); Chris Feng, Fort Collins, CO (US); Phil Nikkel, Loveland, CO (US); John Choy, Westminster, CO (US); Alexandre Augusto Shirakawa, San Jose, CA (US); Tina L. Lamers, Fort Collins, CO (US); Sook Ching Chang, San Jose, CA (US); Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 74 days.

(21) Appl. No.: 14/266,445

(22) Filed: Apr. 30, 2014

(65) Prior Publication Data

US 2015/0318837 A1 Nov. 5, 2015

(51) Int. Cl.
*H03H 9/02* (2006.01)
*H03H 3/013* (2006.01)
*H03H 9/17* (2006.01)
*H03H 9/13* (2006.01)

(52) U.S. Cl.
CPC .......... *H03H 9/02102* (2013.01); *H03H 3/013* (2013.01); *H03H 9/02086* (2013.01); *H03H 9/173* (2013.01); *H03H 9/132* (2013.01)

(58) Field of Classification Search
CPC .......... H03H 9/02086; H03H 9/02125; H03H 9/02102; H03H 9/02448; H03H 9/02842; H03H 9/08; H03H 9/132; H03H 3/013; H03H 9/173

USPC .......... 333/133, 186–188; 310/346
See application file for complete search history.

(56) References Cited

U.S. PATENT DOCUMENTS

| | | | |
|---|---|---|---|
| 5,587,620 A | 12/1996 | Ruby et al. |
| 5,873,153 A | 2/1999 | Ruby et al. |
| 6,107,721 A | 8/2000 | Lakin |
| 6,384,697 B1 | 5/2002 | Ruby |
| 6,507,983 B1 | 1/2003 | Ruby et al. |
| 6,548,943 B2 | 4/2003 | Kaitila et al. |
| 7,275,292 B2 | 10/2007 | Ruby et al. |

(Continued)

OTHER PUBLICATIONS

Co-pending U.S. Appl. No. 13/955,774 filed Jul. 31, 2013.

(Continued)

*Primary Examiner* — Benny Lee
*Assistant Examiner* — Jorge Salazar, Jr.

(57) ABSTRACT

A bulk acoustic wave (BAW) resonator device includes a substrate defining a cavity, a bottom electrode formed over the substrate and at least a portion of the cavity, a piezoelectric layer formed on the bottom electrode, and a top electrode formed on the piezoelectric layer. An air-wing and an air-bridge are formed between the piezoelectric layer and the top electrode, the air-wing having an inner edge that defines an outer boundary of an active region of the BAW resonator device. The BAW resonator device further includes a temperature compensation feature having positive temperature coefficient for offsetting at least a portion of a negative temperature coefficient of the piezoelectric layer. The temperature compensation feature extends outside the active region by a predetermined length.

20 Claims, 11 Drawing Sheets

(56) References Cited

U.S. PATENT DOCUMENTS

| | | |
|---|---|---|
| 7,280,007 B2 | 10/2007 | Feng et al. |
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,466,213 B2 | 12/2008 | Loebl et al. |
| 7,629,865 B2 | 12/2009 | Ruby |
| 8,253,513 B2 | 8/2012 | Zhang |
| 8,575,820 B2 | 11/2013 | Shirakawa et al. |
| 2007/0205850 A1 | 9/2007 | Jamneala et al. |
| 2008/0258842 A1 | 10/2008 | Ruby et al. |
| 2010/0327697 A1 | 12/2010 | Choy et al. |
| 2010/0327994 A1 | 12/2010 | Choy et al. |
| 2011/0006860 A1* | 1/2011 | Hara ............... H03H 3/02 333/187 |
| 2012/0218055 A1 | 8/2012 | Burak et al. |
| 2012/0218057 A1 | 8/2012 | Burak et al. |
| 2013/0063227 A1 | 3/2013 | Burak et al. |
| 2013/0106534 A1 | 5/2013 | Burak et al. |
| 2014/0111288 A1 | 4/2014 | Nikkel et al. |

OTHER PUBLICATIONS

Co-pending U.S. Appl. No. 13/663,449 filed Oct. 29, 2012.
Co-pending U.S. Appl. No. 13/660,941 filed Oct. 25, 2012.
Co-pending U.S. Appl. No. 13/662,425 filed Oct. 27, 2012.
Co-pending U.S. Appl. No. 13/662,460 filed Oct. 27, 2012.
Co-pending U.S. Appl. No. 14/092,026 filed Nov. 27, 2013.
Co-pending U.S. Appl. No. 14/192,599 filed Feb. 27, 2014.
Humberto Campanella Pineda, "Thin-film bulk acoustic wave resonators—FBAR", Bellaterra i Montpellier, Dec. 2007, pp. 1-241.
Vikram A. Thakar et al., "Piezoelectrically Transduced Temperature-Compensated Flexural-Mode Silicon Resonators", Journal of Microelectromechanical Systems, 2013, pp. 1-9.
Co-pending U.S. Appl. No. 13/658,024 filed Oct. 23, 2012.
Co-pending U.S. Appl. No. 13/654,718 filed Oct. 18, 2012.
Co-pending U.S. Appl. No. 13/766,399 filed Feb. 13, 2013.

* cited by examiner

ACOUSTIC RESONATOR DEVICE WITH AIR-RING AND TEMPERATURE COMPENSATING LAYER

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the active region or main membrane region is defined, roughly, by an overlap between the two plate electrodes and the piezoelectric material, and the peripheral regions are defined as areas outside the main membrane region. The main membrane region may be the same as an active region of the acoustic resonator, or may contain the active region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, an air-bridge may be formed under the top electrode on the top electrode connecting edge of the acoustic resonator in order to eliminate the transducer effect over the substrate. In another example, a frame may be formed by a conductive or dielectric material within the boundary of the main membrane region to minimize scattering of electrically excited piston mode at top electrode edges and improve confinement of mechanical motion to the main membrane region.

Conventional FBARs, for example, rely on strong confinement of electrically excited piston mode. Strong confinement is provided by the edges of the top and bottom electrodes, as well as ancillary structural features, such as air-rings (e.g., including air-bridges and/or air-wings) and conventional outside frames. While the apparent advantage of strong confinement is that it enforces quasi-clamping of mechanical motion at the edge of the top electrode, it also provides significant acoustic discontinuities, leading to scattering of energy out of the desired piston mode into undesired extensional, shear, flexural and dilatational modes of the whole structure.

In addition, FBAR filters in particular need to guarantee sufficiently low insertion loss (IL) across temperature ranges, as well as frequency ranges. Typically, as ambient temperature increases, sound velocity of most materials decreases and the cutoff frequency of each of the FBARs forming the filter decreases. Thus, as the temperature increases, the pass-band of the filter generally moves towards lower frequencies. Therefore, in the absence of temperature compensation, the pass-band must be designed wide enough to allow for changes of the ambient temperature, requiring a high coupling coefficient Kt2 of each FBAR, which may be difficult to achieve. Also, in some cases (e.g., Band 13), the pass-band may not be allowed to move to prevent encroachment on other (e.g. safety) bands. Temperature compensation of the filter (and therefore each FBAR) may be required. For example, boron-doped silicon oxide SiOx (which may be referred to as "tempco oxide") may be added as a temperature compensating layer to the FBAR. The sound velocity of tempco oxide increases with temperature, which yields the desired stabilization of acoustic resonator and filter response with changes in ambient temperature. The temperature compensating layer may be embedded into either top or bottom electrode, with all the associated process complications. Other structures may then be used to improve parallel resistance Rp and quality factor Q (referred to as "Q-factor"), such as top electrode air-bridges (to eliminate dead-FBAR) and add-on frames on top electrode (to minimize scattering at the top electrode edges).

Typically, the temperature compensating layer lowers the effectiveness of add-on frames used for Q-factor improvement. The reason is that low acoustic impedance of the temperature compensating layer confines a significant amount of energy both from the piston mode and from stack eigenmodes that are confined to the part of the resonator stack where the temperature compensating layer is placed. The typical add-on frames are placed on the top of the stack in order to facilitate growth of high-quality planar piezoelectric layer. The temperature compensating layer may be placed either below or above the piezoelectric layer, which limits the effectiveness of top add-on frames on suppressing the eigen-modes confined to the bottom of the resonator stack. Thus, approaches allowing for temperature compensating layers within a BAW resonator stack are needed for applications requiring high Q-factor and temperature compensated frequency response. Accordingly, in view of these and other shortcomings of conventional acoustic resonators, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
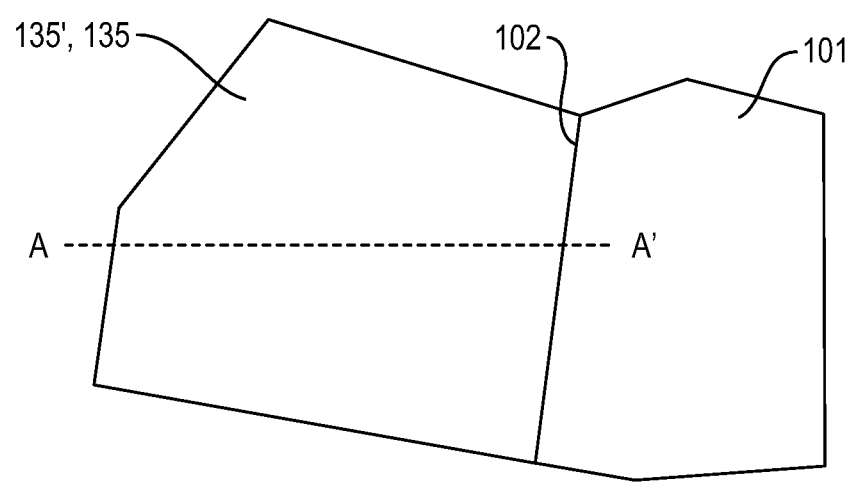
FIG. 1A is a top view of an acoustic resonator having a temperature compensating layer, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), for example. For simplicity of explanation, several embodiments are described in the context of FBAR technologies; however, the described concepts can be adapted for use in other types of acoustic resonators. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275, 292 and 7,629,865 to Ruby et al.; U.S. Pat. No. 7,280,007 to Feng, et al.; U.S. Patent App. Pub. No. 2007/0205850 to Jamneala et al. (issued as U.S. Pat. No. 9,082,464 on Jul. 14, 2015); U.S. Pat. No. 7,388,454 to Ruby et al.; U.S. patent application Ser. No. 13/658,024 to Nikkel et al. (published as U.S. Patent App. Pub. No. 2014/0111288 on Apr. 24, 2014); U.S. patent application Ser. No. 13/955,774 to Burak et al. (published as U.S. Patent App. Pub. No. 2013/0314177 on Nov. 28, 2013); U.S. patent application Ser. No. 13/663,449 to Burak et al. (published as U.S. Patent App. Pub. No. 2014/ 0118091 on May 1, 2014); U.S. patent application Ser. No. 13/660,941 to Burak et al. (published as U.S. Patent App. Pub. No. 2014/0118088 on May 1, 2014); U.S. patent application Ser. No. 13/654,718 to Burak et al. (issued as U.S. Pat. No. 9,099,983 on Aug. 4, 2015); U.S. Patent App. Pub. No. 2008/ 0258842 to Ruby et al. (issued as U.S. Pat. No. 7,714,684 on May 11, 2010); and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In a representative embodiment, a bulk acoustic wave (BAW) resonator device includes a substrate, a bottom electrode formed over the substrate, a piezoelectric layer formed on the bottom electrode, and a top electrode formed on the piezoelectric layer. An air-wing and an air-bridge are formed between the piezoelectric layer and the top electrode, the air-wing having an inner edge that defines an outer boundary of an active region of the BAW resonator device. The BAW resonator device further includes a temperature compensation feature having positive temperature coefficient for offsetting at least a portion of a negative temperature coefficient of the piezoelectric layer. The temperature compensation feature extends outside the active region by a predetermined length. Although the following description presents embodiments in the form of FBAR devices, several of the described concepts could be implemented in other forms of acoustic resonators, such as SMRs, for example.

In another representative embodiment, a BAW resonator device includes a substrate defining a cavity; a bottom electrode formed over the substrate and at least a portion of the cavity; a piezoelectric layer formed on the bottom electrode; a top electrode formed on the piezoelectric layer; an outer frame formed on or in the top electrode, the outer frame having an inner edge that defines an outer boundary of an active region of the BAW resonator device; an air-wing and an air-bridge formed between the piezoelectric layer and the top electrode of the acoustic stack; and a temperature compensation feature having positive temperature coefficient for offsetting at least a portion of a negative temperature coefficient of at least the piezoelectric layer. The temperature compensation feature extends outside the active region by a predetermined length.

Figure 1B:
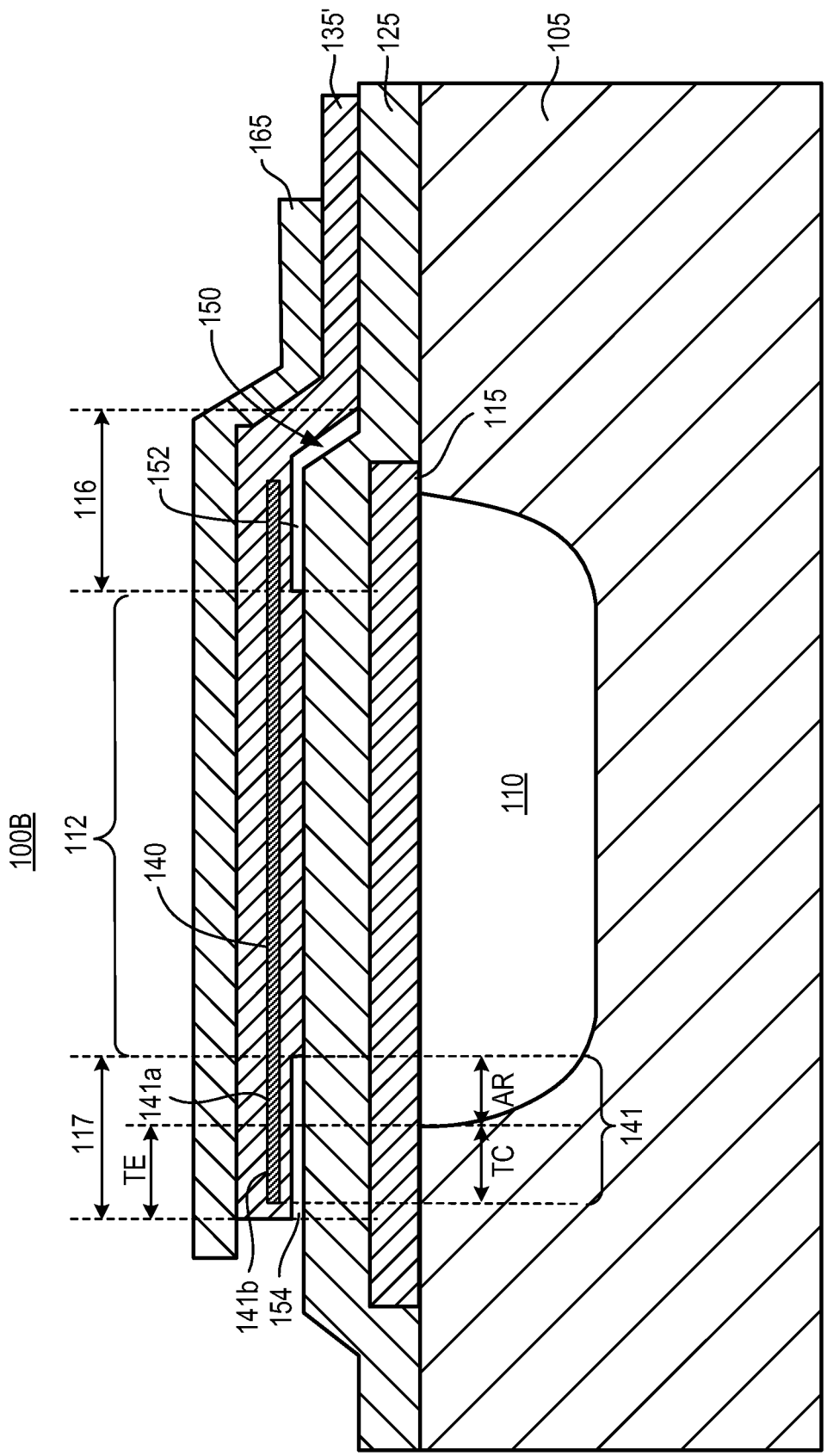
FIG. 1B is a cross-sectional view of an acoustic resonator having a temperature compensating layer, according to a representative embodiment.
Figure 1C:
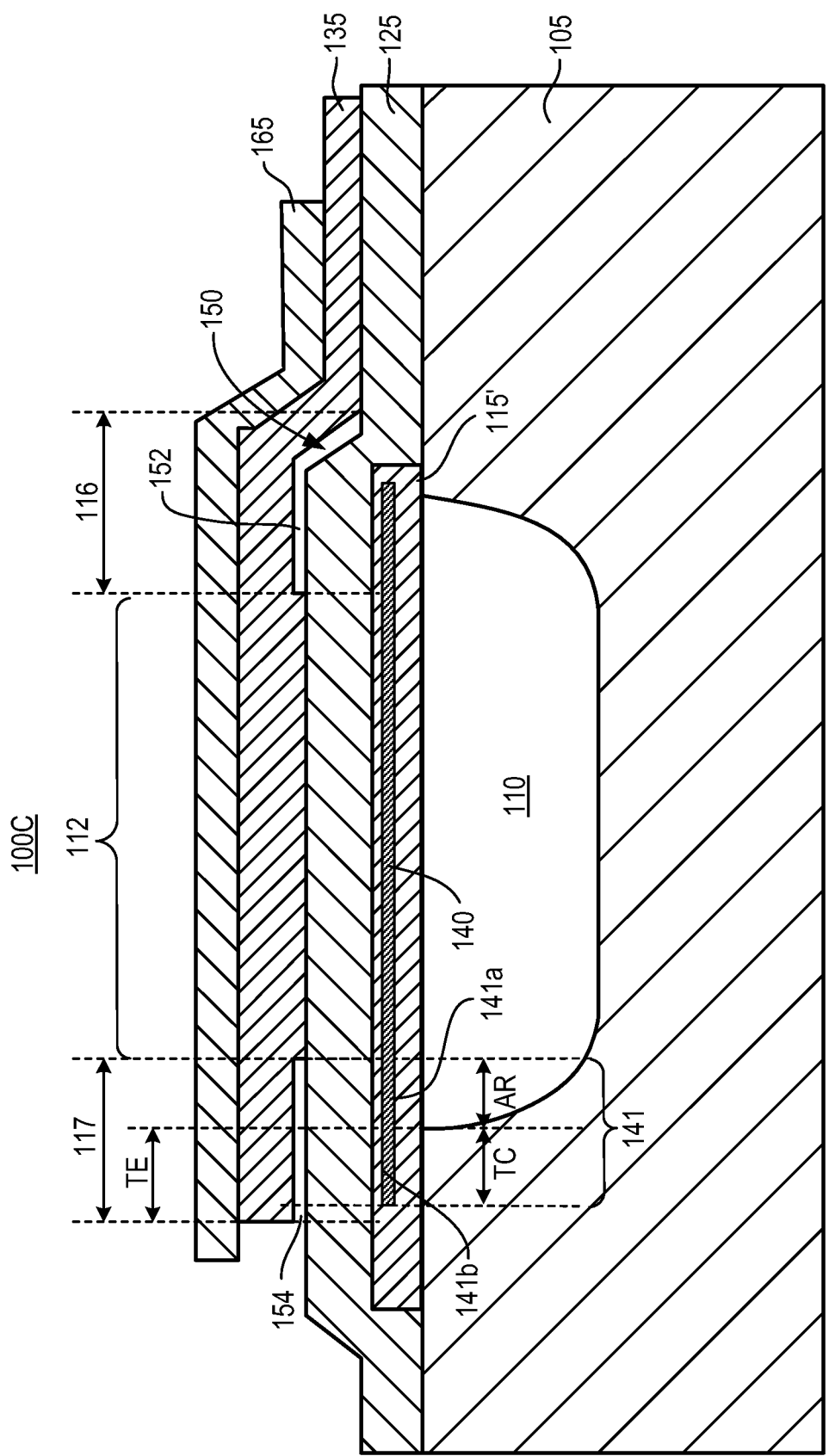
FIG. 1C is a cross-sectional view of an acoustic resonator having a temperature compensating layer, according to a representative embodiment.
Figure 1D:
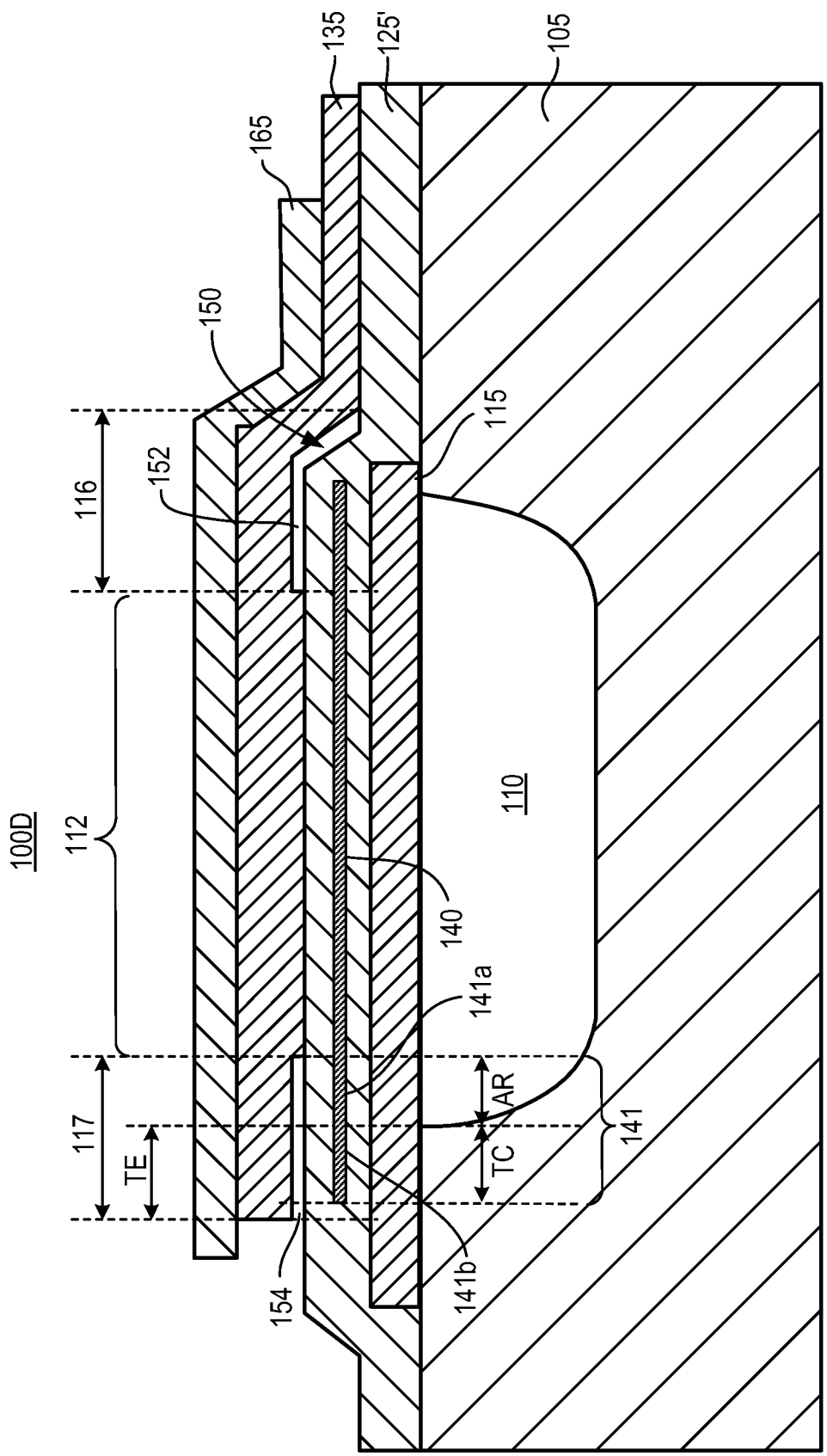
FIG. 1D is a cross-sectional view of an acoustic resonator having a temperature compensating layer, according to a representative embodiment.

FIG. 1A is a top view of an acoustic resonator 100A according to a representative embodiment, and FIGS. 1B-1D are cross-sectional views of acoustic resonator 100A, taken along a line A-A' according to different embodiments. The cross-sectional views correspond to different variations of acoustic resonator 100A and will be referred to, respectively, as acoustic resonators 100B-100D. Acoustic resonators 100B-100D have many of the same features, so a repetitive description of these features may be omitted in an effort to avoid redundancy.

Referring to FIG. 1A, acoustic resonator 100A comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100A.

The five sides of top electrode 135 have different lengths, forming an apodized pentagon shape. In alternative embodiments, top electrode 135 may have a different number of sides. Although not shown in the drawings, other embodiments of acoustic resonators, such as those of FIGS. 2A through 3C, may have an appearance similar to that of FIG. 1A when viewed from the top. Also, the acoustic resonators of FIGS. 1B through 3C may be formed in differently alternative shapes, such as circular, square, rectangular, trapezoidal, etc., without departing from the scope of the present teachings.

FIGS. 1B-1D are cross-sectional diagrams illustrating acoustic resonators, according to representative embodiments. In the examples depicted in FIGS. 1B-1D (as well as the examples depicted in FIGS. 2A to 3C, discussed below), each of the acoustic resonators is an FBAR, including a cavity formed in a substrate, for convenience of explanation. However, it is understood that other types of acoustic resonators may be included, without departing from the scope of the present teachings. For example, the acoustic resonator may include an acoustic reflector or acoustic mirror, such as a distributed Bragg reflector (DBR) formed on the substrate in place of the cavity making the acoustic resonator an SMR. It is understood that the same general configurations may be included in acoustic resonators having frames and/or air-rings in various locations, without departing from the scope of the present teachings.

Referring to FIG. 1B, acoustic resonator 100B (e.g., an FBAR) comprises a substrate 105 defining a cavity 110, which may be an air cavity, a bottom (first) electrode 115 disposed on the substrate 105 and cavity 110, a piezoelectric layer 125 disposed on the bottom electrode 115, and a top (second) electrode 135' disposed on the piezoelectric layer 125. Collectively, the bottom electrode 115, the piezoelectric layer 125, and the top electrode 135' constitute an acoustic stack of acoustic resonator 100B. Also, an overlap among the bottom electrode 115, the piezoelectric layer 125 and the top electrode 135' over the cavity 110 provides an active region 112 of the acoustic resonator 100B. A passivation layer 165 (optional) is disposed top of top electrode 135' with thickness sufficient to insulate all layers of the acoustic stack from the environment, including protection from moisture, corrosives, contaminants, debris and the like.

In an alternative configuration, the acoustic resonator 100B (as well as the acoustic resonators depicted in FIGS. 1C to 3C, discussed below) may further include a planarization layer (not shown) disposed adjacent to the bottom electrode 115 on the substrate 105, in which case the piezoelectric layer 125 is disposed on a combined planarized surface of the bottom electrode 115 and the planarization layer 120, and the top electrode 135' is disposed on the piezoelectric layer 125. Layer planarization and corresponding potential benefits are presented in U.S. Patent Application Publication No. 2013/0106534 (published May 2, 2013) to Burak et al., which is hereby incorporated by reference in its entirety.

The substrate 105 may be formed of a material compatible with semiconductor processes, such as silicon (Si), gallium arsenide (GaAs), indium phosphide (InP), glass, sapphire, alumina, or the like, for example. The cavity 110 may be formed by etching a cavity in the substrate 105 and filling the etched cavity with a sacrificial material, such as phosphosilicate glass (PSG), for example, which is subsequently removed to leave an air space. In general, the depth of the cavity 110 is determined by the etch properties of the sacrificial material and by possible downward bowing of the released membrane (i.e., layers of acoustic resonator 100B disposed over cavity 110) in the case of residual compressive stress in the layers of the membrane being present. Usually deeper cavities are more beneficial from the membrane release process point of view, but they also yield somewhat more difficult initial etch process. Various illustrative fabrication techniques for cavity in a substrate are described by U.S. Pat. No. 7,345,410 (Mar. 18, 2008), to Grannen et al., which is hereby incorporated by reference in its entirety. As mentioned above, in alternative configurations, the acoustic resonator(s) described herein may be an SMR, in which an acoustic mirror, such as a DBR, is formed on the substrate in place of or in addition to the cavity. Various illustrative fabrication techniques of acoustic mirrors are described by in U.S. Pat. No. 7,358,831 (Apr. 15, 2008), to Larson III, et al., which is hereby incorporated by reference in its entirety.

Each of the bottom electrode 115 and the top electrode 135' may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 115 and/or the top electrode 135' may be formed of two or more layers of electrically conductive materials, which may be the same as or different from one another. Also, the configuration and/or the material(s) forming the top electrode 135' may be the same as or different from the configuration and/or the material(s) forming the bottom electrode 115.

The piezoelectric layer 125 may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator 100B (as well as the other acoustic resonator described herein) without departing from the scope of the present teachings. Also, in various embodiments, piezoelectric layer 125 may be "doped" with at least one rare earth element, such as scandium (Sc), yttrium (Y), lanthanum (La), or erbium (Er), for example, to increase the piezoelectric coupling coefficient e33 in the piezoelectric layer 125, thereby off-setting at least a portion of the degradation of the electromechanical coupling coefficient Kt2 of the acoustic resonator, e.g., caused by top air-ring 150, discussed below. Examples of doping piezoelectric layers with one or more rare earth elements for improving electromechanical coupling coefficient Kt2 are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, doping piezoelectric layers with one or more rare earth elements may be applied to any of various embodiments, including the embodiments described below with reference to FIGS. 1C through 3C.

Referring again to FIG. 1B, a top air-ring 150 is formed between the piezoelectric layer 125 and the top electrode 135'. The top air-ring 150 extends along all or a portion of the perimeter of the acoustic resonator 100B. Generally, the air-ring 150 formed between the piezoelectric layer 125 and the top electrode 135' comprises an air-bridge 152 on the connection side of the top electrode 135' and an air-wing 154 along the remaining outside perimeter. The inner edges of the air-ring 150 (i.e., the respective inner edges of the air-bridge 152 and the air-wing 154) may substantially define an outer boundary of an active region 112 of the acoustic resonator 100B (depending on other features present, such as inner and outer add-on frames, discussed below). In the depicted configuration, the active region 112 corresponds to a main membrane region of the acoustic resonator 100B. Vertical lines indicate the boundary of the active region 112. The width of the air-bridge 152 defines an air-bridge extension region 116 and the air-wing 154 defines an air-wing region 117. Additional vertical lines indicate the boundaries of air-bridge extension region 116 and the air-wing region 117, respectively.

As shown in FIG. 1B, a temperature compensation feature is included in the top electrode 135', depicted as representative temperature compensating layer 140, which stabilizes changes of the sound velocity and the cut-off frequency of the piezoelectric layer 125 in response to changes in temperature. More particularly, the temperature compensating layer 140 is formed of a material having a positive temperature coefficient for offsetting at least a portion of a negative temperature coefficient of the piezoelectric layer 125, as well as portions of negative temperature coefficients of the bottom electrode 115 and the top electrode 135'. The temperature compensating layer 140 may be formed of various compatible materials, including tetraethyl orthosilicate (TEOS), silicon dioxide (SiO$_2$), boron silicate glass (BSG), chromium (Cr), and/or tellurium oxide (TeO(x)), for example, which have positive temperature coefficients. The material(s) may be deposited by plasma-enhanced chemical vapor deposition (PECVD) or physical vapor deposition (PVD), for example, although other processes may be used without departing from the scope of the present teachings.

In the depicted embodiment, the temperature compensating layer 140 is buried or encapsulated in the top electrode 135'. Thus, the top electrode 135' includes a conductive interposer layer stacked on the piezoelectric layer 125, the temperature compensating layer 140 stacked on the conductive interposer layer, and an outside electrode layer stacked on the temperature compensating layer. The conductive interposer layer and the outside electrode layer connect with one another around the outer edge of the temperature compensating layer 140 to provide the encapsulation. That is, the interposer layer separates the temperature compensating layer 140 from the piezoelectric layer 125, so that the temperature compensating layer 140 is effectively buried or encapsulated within the top electrode 135'. Examples of a temperature compensating layer buried or encapsulated in a top electrode, including fabrication methods, are described and illustrated in U.S. patent application Ser. No. 14/092,026 (filed Nov. 27, 2013) to Burak et al. (published as U.S. Patent App. Pub. No. 2014/0152152 on Jun. 5, 2014), which is hereby incorporated by reference in its entirety.

An outer edge of the temperature compensating layer 140 is located beyond the inner edge of the air-wing 154 by a predetermined length. Stated differently, the temperature compensating layer 140 extends outside the active region 112 of the acoustic resonator 100B by the predetermined length. The portion of the temperature compensating layer 140 extending beyond the active region 112 is indicated as end portion 141 of the temperature compensating layer 140. In the depicted embodiment, the end portion 141 includes a first section 141a (indicated by arrow AR) having a first predetermined length that extends from the outer boundary of the active region 112 (e.g., the inner edge of the air-wing 154) to the outer edge of the cavity 110. Thus, the predetermined length of the temperature compensating layer 140 that extends outside the active region 112 is the sum of the first and second predetermined lengths. The end portion 141 further includes a second section 141b (indicated by arrow TC) that has a second predetermined length that extends past the outer edge of the cavity 110 to the outer edge of the temperature compensating layer 140. The lengths of the first section 141a and the second section 141b, as well as the overall predetermined length of the end portion 141, may be adjusted to optimize various operational parameters of the acoustic resonator 100B, such as to maximize at least one of a Q-factor value and a parallel resistance Rp value of the acoustic resonator 100B, for example. Arrow TE indicates the length from the outer edge of the cavity 110 to the outer edge of the top electrode 135'.

In the depicted embodiment, the respective lengths of the first section 141a and the second section 141b are about the same (e.g., approximately 2.0 µm or greater). However, the lengths may be adjusted to achieve specific design objectives, such as a target resonant frequency, series resistance Rs, parallel resistance Rp, and/or electromechanical coupling coefficient $Kt^2$, without departing from the scope of the present teachings. That is, the first and second end sections 141a and 141b may be longer or shorter, but still have the same lengths as one another. Likewise, the first and second end sections 141a and 141b may have different lengths from one another, where the first section 141a is longer or shorter than the second section 141b. For example, the length of the first section 141a may be about 3.5 µm, while the length of the second section 141b may be about 1 µm, or alternatively the length of the first section 141a may be about 1.0 µm, while the length of the second section 141b may be about 2.0 µm.

The air-bridge 152 and the air-wing 154 (and other air-bridges and wings described in connection with representative embodiments below) may have a height (y-dimension in the coordinate system of FIG. 1B) of approximately 300 Å to approximately 5000 Å, for example. Notably, the lower limit of the height is determined by the limits of the process of releasing sacrificial material in the forming of the air-bridge 152 and the air-wing 154. The upper limit of the height is determined by the quality of layers deposited over the air-bridge 152 and the air-wing 154 and by the quality of subsequent processing of possibly non-planar structures.

In alternative embodiments, discussed below with reference to FIGS. 3A to 3C, the outer edge of the temperature compensating layer 140 may be located within of an outer edge of the cavity 110, while still extending beyond the outer boundary of the active region 112. That is, the end portion 141 extending from the outer boundary of the active region 112 would terminate after a predetermined distance before reaching the outer edge of the cavity 110.

There is a consistent trade-off between temperature compensation and electromechanical coupling coefficient Kt2, in that higher temperature compensation (or lower absolute value), the lower the electromechanical coupling coefficient Kt2. Also, the Q-factor degrades when the temperature compensating layer 140 is added. However, the alignment features indicated by the AR and TC (associating the temperature compensating layer 140 with the air-wing 154), improve the Q-factor. Further optimization, such as the addition of inner and outer frames, discussed below with reference to FIGS. 2A to 2C, may be incorporated to further improve the Q-factor.

The air-bridge 152 is disposed on connection side 101 (in FIG. 1A), and therefore is enclosed by the top electrode 135'. The air-wing 154 is disposed along the remaining sides of the acoustic resonator 100B (i.e., along the remaining perimeter), and therefore is open on one side. The cross-sectional shapes of the air-bridge 152 and the air-wing 154 may vary from the shapes sections shown in FIG. 1B. For example, the cross-sections may have rectangular shapes (e.g., when a planarization layer is included adjacent to the bottom electrode 115 on the substrate 105), trapezoidal sectional shapes, angular shapes, and the like, without departing from the scope of the present teachings. Examples of configurations, dimensions, shapes, and the like with regard to air-bridges and/or air-wings are described and illustrated in U.S. Patent Application Publication No. 2012/0218055 (published Aug. 30, 2012) to Burak et al. (issued as U.S. Pat. No. 9,136,818 on Sep. 15, 2015), U.S. Patent Application Publication No. 2012/0218057 (published Aug. 30, 2012) to Burak et al. (issued as U.S. Pat. No. 9,203,374 on Dec. 1, 2015), U.S. Patent Application Publication No. 2010/0327697 (published Dec. 30, 2010) to Choy et al. (issued as U.S. Pat. No. 8,248,185 on Aug. 21, 2012); and U.S. Patent Application Publication No. 2010/0327994 (published Dec. 30, 2010) to Choy et al. (issued as U.S. Pat. No. 8,902,023 on Dec. 2, 2014), the disclosures of which are hereby incorporated by reference in their entireties.

In certain embodiments, the air-bridge 152 of the air-ring 150 (and other air-bridges described in connection with representative embodiments below) extends over the cavity 110 by an overlap (also referred to as decoupling region), determining separation of the outer edge of the active region 112 from the substrate 105 edge. The decoupling region helps to remove at least a portion of the "dead FBAR area," which decouples the top electrode 135 from the bottom electrode 115. Also, the air-bridge 152 extends over the piezoelectric layer 125 by an air-bridge extension (also referred to as the air-bridge extension region 116, mentioned above). The decoupling region has a width (x-dimension) of approximately 0.0 µm (i.e., no overlap with the cavity 110) to approximately 10.0 µm, and the air-bridge extension region 116 has a width of approximately 0.0 µm (i.e., no air-bridge) to approximately 50.0 µm, for example. Meanwhile, the air-wing region 117 defined by the air-wing 154 provides a different boundary condition, which helps to suppress acoustic loss.

Generally, optimum widths of the decoupling region and the air-bridge extension region 116 of the air-bridge 152 (and other air-bridges described in connection with representative embodiments below) depend on the reflection and suppression of the eigen-modes at the boundary of the active region 112 and the decoupling region (i.e., the cavity overlap). Due to substantially increased cut-off frequency of the combined bottom electrode 115 and piezoelectric layer 125 stack in the decoupling region, only complex evanescent modes (for the thickness-extensional motion) and propagating flexural and dilatational modes can exist at the operating frequency of the acoustic resonator 100B. Also, due to substantially increased cut-off frequency of the top electrode 135' in the air-bridge extension region 116, only complex evanescent modes (for the thickness-extensional motion) and propagating flexural and dilatational modes can exist at the operating frequency of the acoustic resonator 100B. The complex evanescent modes in the decoupling region and the air-bridge extension region 116 are characterized by a characteristic decay length and by a specific propagation constant. Thus the air-bridge 152, for example, needs to be wide enough to ensure suitable decay of complex evanescent waves excited at the boundary of the active region 112 and the decoupling region and the air-bridge extension region 116. Air-bridges and air-wings and corresponding effects are described and illustrated, for example, in U.S. patent application Ser. No. 14/192,599 (filed Feb. 27, 2014) to Burak et al. (published as U.S. Patent App. Pub. No. 2014/0176261 on Jun. 26, 2014), which is hereby incorporated by reference in its entirety.

As mentioned above, the top air-ring 150, comprising the air-bridge 152 and the air-wing 154, typically defines a perimeter along the active region 112 of the acoustic resonator 100B. The active region 112 thus includes the portions of the acoustic resonator 100B disposed over the cavity 110 and bounded by the perimeter provided by the top air-ring 150. Accordingly, the active region 112 is bordered around its perimeter by an acoustic impedance discontinuity created at least in part by air-bridge 152 and air-wing 154, and above and below (the cavity 110) by an acoustic impedance discontinuity due to the presence of air. Thus, a resonant cavity is beneficially provided in the active region 112 of the acoustic resonator 100B.

In the depicted embodiment, air-bridge 152 and air-wing 154 are unfilled, i.e., they contain air. In other embodiments, these structures may be "filled", e.g., with a dielectric or metal material to provide the desired acoustic impedance discontinuity. It is noted that the described structures do not necessarily have to extend along all edges of acoustic resonator 100B (as well as the acoustic resonators depicted in FIGS. 1C-3C). For example, they may be provided on only a subset of the five-sided acoustic resonator 100A shown in FIG. 1A.

During illustrative operation of the acoustic resonator 100B (e.g., as a part of a ladder filter), an input electrical signal is applied to an input terminal of bottom electrode 115 and top electrode 135' is connected to the output terminal. The input electrical signal typically comprises a time-varying voltage that causes vibration in the active region 112. This vibration in turn produces an output electrical signal at an output terminal of top electrode 135'. The input and output terminals may be connected to bottom and top electrodes 115 and 135' via connection edges that extend away from the active region 112 as shown in FIG. 1B. The input and output terminals of acoustic resonator 100B may be connected to appropriate terminals of other acoustic resonators forming the ladder filter, for instance.

The presence of the top air-ring 150 can be used to address these and other forms of scattering and related degradation of performance. The acoustic impedance mismatches provided by air-bridge 152 and air-wing 154 cause reflection and suppression of acoustic waves at the boundary that may otherwise propagate out of the active region 112 resulting in energy loss. Accordingly, the air-bridge 152 and the air-wing 154 may serve to suppress excitation on unwanted propagating modes in the active region 112 and outside regions, resulting in better energy confinement within the active region 112 and reduction of energy losses to acoustic radiation in the acoustic resonator 100B. Reducing such losses increases the Q-factor of acoustic resonator 100B. In filter applications of acoustic resonator 100B, for example, as a result of the reduced energy loss, the insertion loss ($S_{21}$) may be beneficially improved.

FIGS. 1C and 1D depict variations of the acoustic resonator 100B with respect to the location of the temperature compensation feature. In particular, acoustic resonator 100C in FIG. 1C is substantially the same as acoustic resonator 100B, except that temperature compensating layer 140 is encapsulated in the bottom electrode (bottom electrode 115'), and acoustic resonator 100D in FIG. 1D is substantially the same as acoustic resonator 100B, except that temperature compensating layer 140 is encapsulated in the piezoelectric layer (piezoelectric layer 125'). In both FIG. 1C and FIG. 1D, air-ring 150 is formed between the piezoelectric layer 125, 125' and the top electrode 135.

Referring to FIG. 1C, in particular, the acoustic resonator 100C comprises substrate 105 defining cavity 110, bottom (first) electrode 115' disposed on the substrate 105 and cavity 110, piezoelectric layer 125 disposed on the bottom electrode 115', top (second) electrode 135 disposed on the piezoelectric layer 125, and passivation layer 165 (optionally) disposed on the top electrode 135. Collectively, the bottom electrode 115', the piezoelectric layer 125, and the top electrode 135 constitute the acoustic stack of acoustic resonator 100C, and an overlap among the bottom electrode 115', the piezoelectric layer 125 and the top electrode 135 over the cavity 110 provides the active region 112. In addition, top air-ring 150 is formed between the piezoelectric layer 125 and the top electrode 135. The top air-ring 150 includes the air-bridge 152 and the air-wing 154, which have respective inner edges that substantially define an outer boundary of the active region 112, which corresponds to the main membrane region in the depicted embodiment.

In the depicted embodiment, the temperature compensating layer 140 is buried or encapsulated in the bottom electrode 115'. Thus, the bottom electrode 115 includes an outside electrode layer stacked on the substrate 105, the temperature compensating layer 140 stacked on the outside electrode layer, a conductive interposer layer stacked on the temperature compensating layer 140, and the piezoelectric layer 125 stacked on the conductive interposer layer. The conductive interposer layer and the outside electrode layer connect with one another around the outer edge of the temperature compensating layer 140 to provide encapsulation. That is, the interposer layer separates the temperature compensating layer 140 from the piezoelectric layer 125, so that the temperature compensating layer 140 is effectively buried or encapsulated within the bottom electrode 115. Examples of a temperature compensating layer buried or encapsulated in a bottom electrode, including fabrication methods, are described and illustrated in U.S. patent application Ser. No. 14/092,026 (filed Nov. 27, 2013) to Burak et al. (published as U.S. Patent App. Pub. No. 2014/0152152 on Jun. 5, 2014), which is hereby incorporated by reference in its entirety.

Referring to FIG. 1D, the acoustic resonator 100D comprises substrate 105 defining cavity 110, bottom (first) electrode 115 disposed on the substrate 105 and cavity 110, piezoelectric layer 125' disposed on the bottom electrode 115, top (second) electrode 135 disposed on the piezoelectric layer 125, and passivation layer 165 (optionally) disposed on the top electrode 135. Collectively, bottom electrode 115, the piezoelectric layer 125', and the top electrode 135 constitute an acoustic stack of the acoustic resonator 100D, and an overlap among the bottom electrode 115, the piezoelectric layer 125' and the top electrode 135 over the cavity 110 provides the active region 112. In addition, top air-ring 150 is formed between the piezoelectric layer 125 and the top electrode 135. The top air-ring 150 includes the air-bridge 152 and the air-wing 154, which have respective inner edges that substantially define an outer boundary of the active region 112, which corresponds to the main membrane region in the depicted embodiment.

In the depicted embodiment, the temperature compensating layer 140 is buried or encapsulated in the piezoelectric layer 125'. Thus, the piezoelectric layer 125' includes first and second piezoelectric sub-layers. That is, a first piezoelectric sub-layer is stacked on the top surface of the bottom electrode 115, the temperature compensating layer 140 stacked on the first piezoelectric sub-layer, and the second piezoelectric sub-layer is stacked on the temperature compensating layer 140. The first and second piezoelectric sub-layers connect with one another around the outer edge of the temperature compensating layer 140 to provide encapsulation. That is, the first piezoelectric sub-layer separates the temperature compensating layer 140 from the bottom electrode 115, and the second piezoelectric sub-layer separates the temperature compensating layer 140 from the top electrode 135, so that the temperature compensating layer 140 is effectively buried or encapsulated within the piezoelectric layer 125. Examples of a temperature compensating layer buried or encapsulated in a piezoelectric layer, including fabrication methods, are described and illustrated in U.S. patent application Ser. No. 14/092,026 (filed Nov. 27, 2013) to Burak et al. (published as U.S. Patent App. Pub. No. 2014/0152152 on Jun. 5, 2014), which is hereby incorporated by reference in its entirety.

In both acoustic resonators 100C and 100D, even though the temperature compensating layer 140 is not in the top electrode 135, which actually defines the air-ring 150, the various predetermined lengths (including the first predetermined length AR of the first section 141a and the second predetermined length TC of the second section 141b) are substantially the same as discussed above with reference to FIG. 1B. That is, an outer edge of the temperature compensating layer 140 is located beyond the inner edge of the air-wing 154 by a predetermined length. Stated differently, the temperature compensating layer 140 extends outside the active region 112 of the acoustic resonator 100C, 100D by the predetermined length. The portion of the temperature compensating layer 140 extending beyond the active region 112 is indicated as end portion 141 of the temperature compensating layer 140. As stated above, the end portion 141 extending beyond the active region 112 includes the first section 141a (indicated by arrow AR) extending from the outer boundary of the active region 112 to the outer edge of the cavity 110 and the second section 141b (indicated by arrow TC) extending from the outer edge of the cavity 110 to the outer edge of the temperature compensating layer 140. The lengths and relative lengths of the first section 141a and the second section 141b, as well as the overall predetermined length of the end portion 141, may be adjusted to optimize various operational parameters of the acoustic resonators 100C, 100D, as discussed above.

Figure 2A:
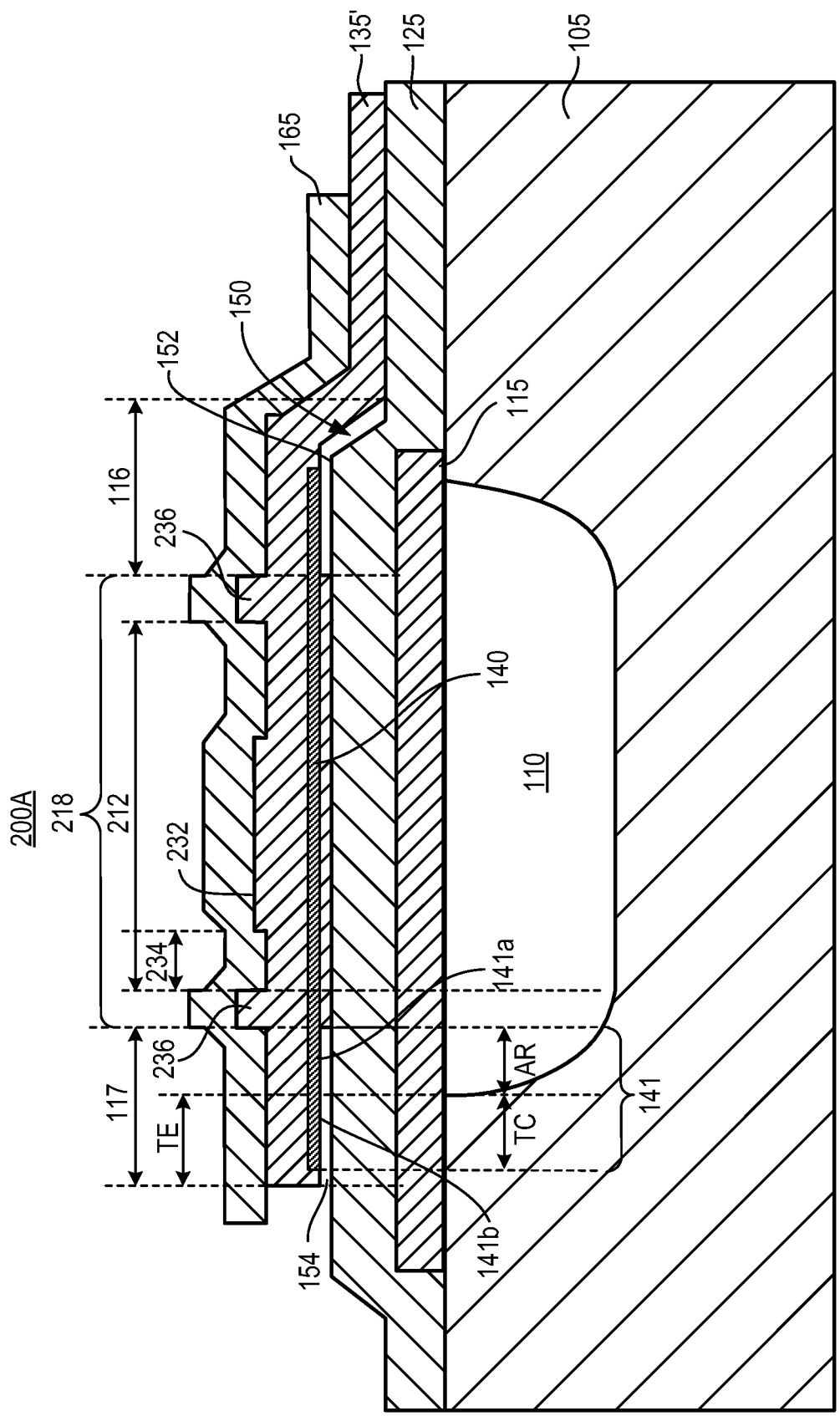
FIG. 2A is a cross-sectional view of an acoustic resonator having a temperature compensating layer and frames, according to a representative embodiment.
Figure 2B:
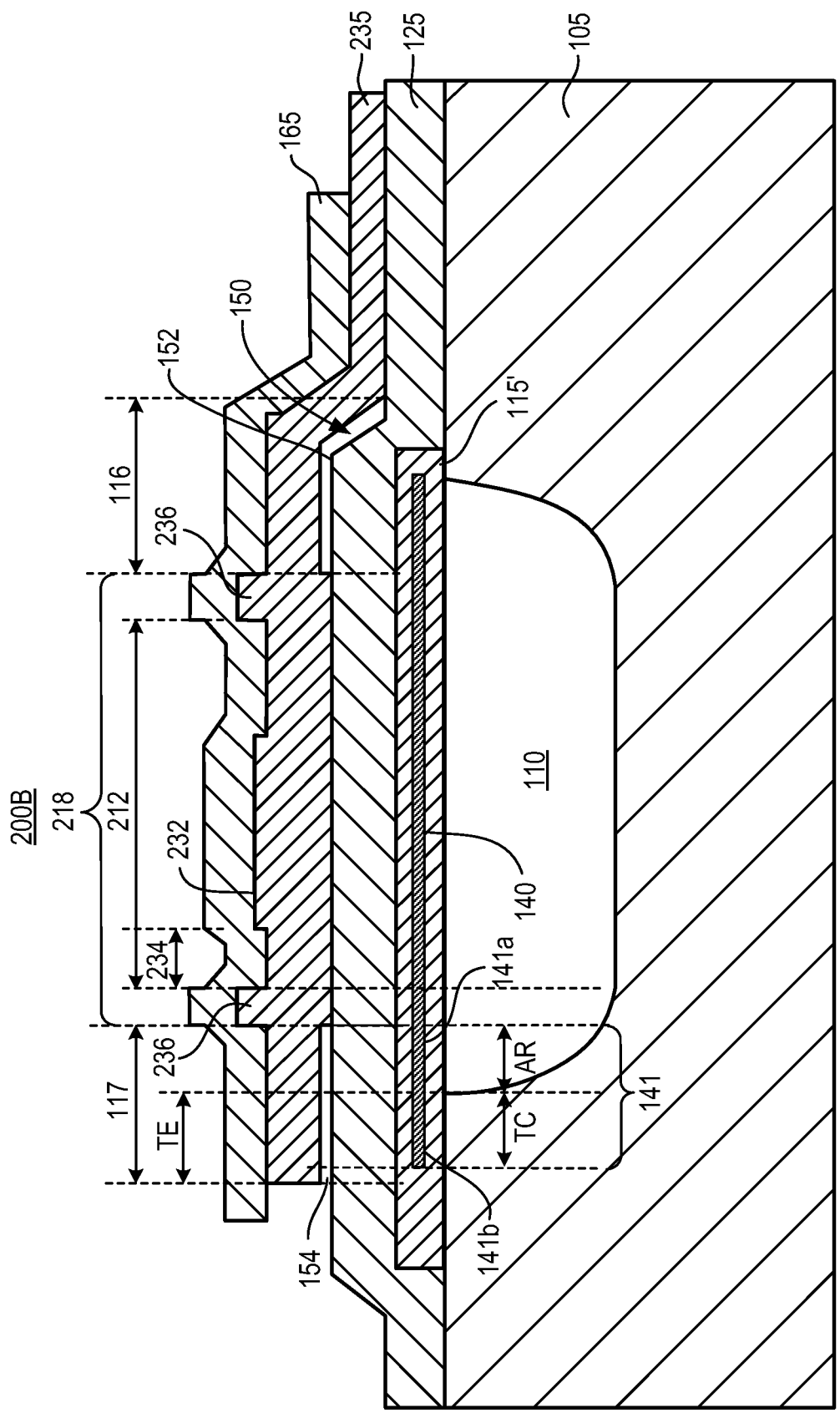
FIG. 2B is a cross-sectional view of an acoustic resonator having a temperature compensating layer and frames, according to a representative embodiment.
Figure 2C:
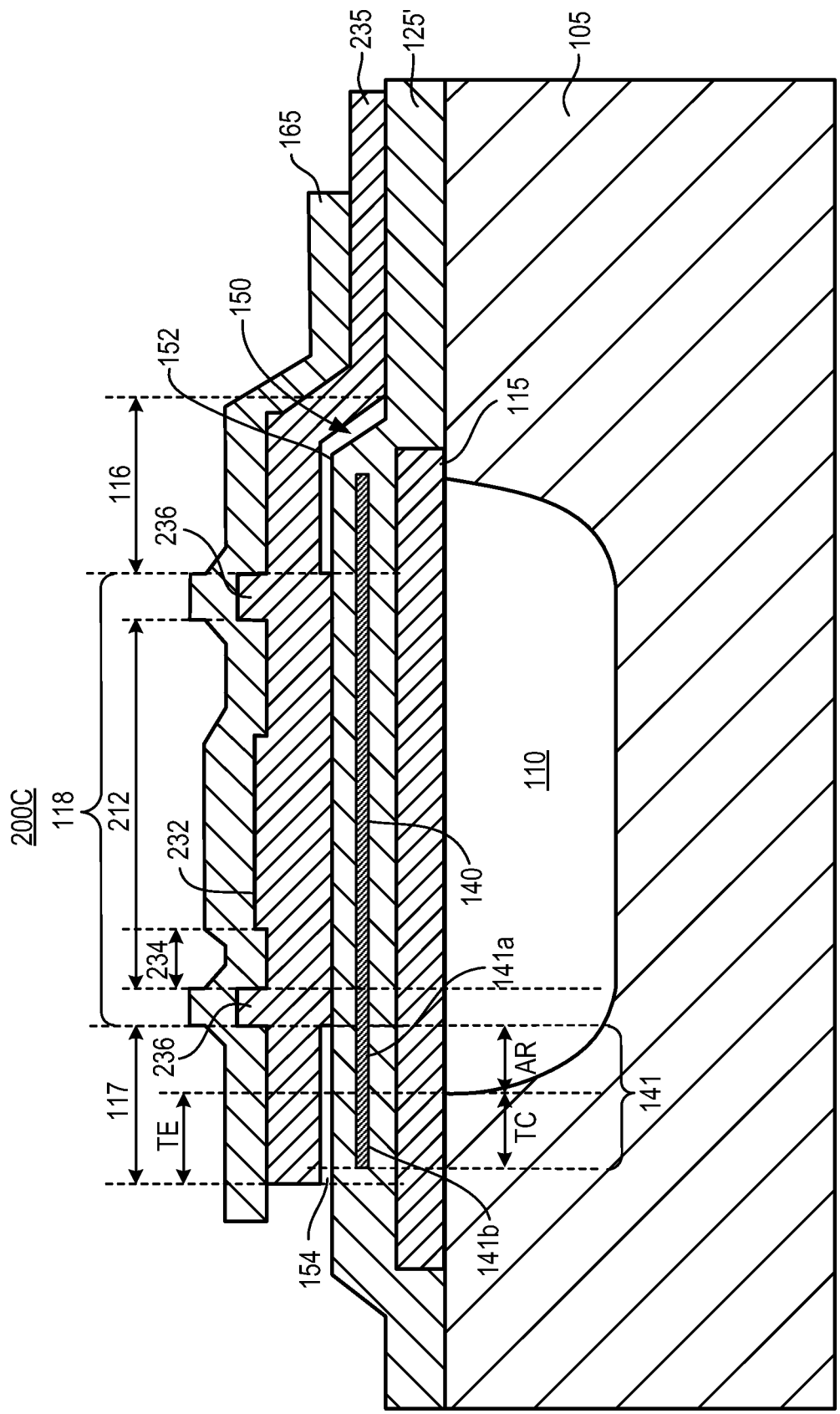
FIG. 2C is a cross-sectional view of an acoustic resonator having a temperature compensating layer and frames, according to a representative embodiment.

FIGS. 2A-2C are cross-sectional diagrams illustrating acoustic resonators having a temperature compensating layer and inner and outer frames, according to representative embodiments.

Referring to FIG. 2A, acoustic resonator 200A is similar to acoustic resonator 100B, except for the addition of inner frame 232 and outer frame 236 formed on the top surface of top electrode 235'. Therefore, the acoustic resonator 200A (e.g., an FBAR) comprises a substrate 105 defining a cavity 110, a bottom (first) electrode 115 disposed on the substrate 105 and cavity 110, a piezoelectric layer 125 disposed on the bottom electrode 115, and top (second) electrode 235' disposed on the piezoelectric layer 125. Collectively, the bottom electrode 115, the piezoelectric layer 125, and the top electrode 235' constitute an acoustic stack of acoustic resonator 200A. An overlap among the bottom electrode 115, the piezoelectric layer 125 and the top electrode 235' over the cavity 110 provides an active region 212 of the acoustic resonator 200A, where an inner edge of the outer frame 236 substantially defines the outer boundaries of the active region 212. A region of the acoustic resonator 200A above and below the outer frame 236 (and bordered by air-ring 150) may be referred to as an outer frame region, and a region of the acoustic resonator 200A above and below the inner frame 232 may be referred to as an inner frame region. A passivation layer 165 (optional) is disposed top of top electrode 235' with thickness sufficient to insulate all layers of the acoustic stack from the environment, including protection from moisture, corrosives, contaminants, debris and the like.

A top air-ring 150 is formed between the piezoelectric layer 125 and the top electrode 135'. As discussed above, the top air-ring 150 extends along all or a portion of the perimeter of the acoustic resonator 200A. The air-ring 150 comprises air-bridge 152 on the connection side of the top electrode 235' and air-wing 154 along the remaining outside perimeter. The inner edges of the air-ring 150 (i.e., the respective inner edges of the air-bridge 152 and the air-wing 154) may substantially define an outer boundary of a main membrane region 118, which encompasses the active region 112, of the acoustic resonator 200A.

In the depicted embodiment, the temperature compensating layer 140 is buried or encapsulated in the top electrode 235', as discussed above with reference to FIG. 1B. An outer edge of the temperature compensating layer 140 is located beyond the inner edge of the air-wing 154 by a predetermined length. Stated differently, the temperature compensating layer 140 extends outside the main membrane region 118 of the acoustic resonator 200A by the predetermined length. The portion of the temperature compensating layer 140 extending beyond the main membrane region 118 is indicated as end portion 141 of the temperature compensating layer 140. In the depicted embodiment, the end portion 141 includes a first section 141a (indicated by arrow AR) having a first predetermined length that extends from the outer boundary of the main membrane region 118 (e.g., the inner edge of the air-wing 154) to the outer edge of the cavity 110. The end portion 141 further includes a second section 141b (indicated by arrow TC) that has a second predetermined length that extends from the outer edge of the cavity 110 to the outer edge of the temperature compensating layer 140. The lengths of the first section 141a and the second section 141b, as well as the overall predetermined length of the end portion 141, may be adjusted to optimize various operational parameters of the acoustic resonator 200A, such as maximizing at least one of a Q-factor value and a parallel resistance Rp value of the acoustic resonator 200A.

As mentioned above, the acoustic resonator 200A also includes inner frame 232 and outer frame 236, which may be add-on frames formed on the top surface of top electrode 235', as shown in FIG. 2A. The inner frame 232 is formed in an inner portion of the top electrode 235', which may be substantially in the center of the top electrode 235', for example, and is at least partially surrounded by the outer frame 236. The inner frame 232 may be an additional thin layer of material or a protrusion from the top electrode 235', as discussed below. The outer frame 236 is formed around an outer perimeter of the top electrode 235'. Similar to the inner frame 232, the outer frame 236 may be an additional thin layer of material or a protrusion from the top electrode 235', as discussed below. The inner and outer frames 232 and 236 define a gap 234 between them.

For example, referring to FIG. 2A, the acoustic resonator 200A may be apodized or irregular in shape, as shown in FIG. 1A, where the inner frame 232 is surrounded by the gap 234, and the gap 234 is surrounded by the outer frame 236, which may follow the outer perimeter of the top electrode 235'. Of course, the acoustic resonator 200A may be formed in alternative shapes, such as circular, square, rectangular, trapezoidal, etc., as mentioned above. The inner frame 232 and the outer frame 236 have substantially the same (perimeter) shape as the acoustic resonator 200A in the depicted embodiment. However, in various embodiments, the inner frame 232 and the outer frame 236 may be shaped differently from one another and/or from the acoustic resonator 200A.

The inner and outer frames 232 and 236 may be formed of one or more conductive or dielectric materials, such as copper (Cu), molybdenum (Mo), aluminum (Al), tungsten (W), iridium (Ir), borosilicate glass (BSG), tetraethyl orthosilicate (TEOS), carbon-doped silicon oxide (CDO), silicon carbide (SiC), silicon nitride (SiN), silicon dioxide ($SiO_2$), aluminum oxide ($Al_2O_3$), aluminum nitride (AlN), zinc oxide (ZnO), lead zirconium titanate (PZT), diamond or diamond-like carbon (DLC), for example. In the illustrative configuration depicted in FIG. 2A, the inner frame 232 is thinner than the outer frame 236. However, in alternative configurations, the inner frame 232 may be thicker than the outer frame 236, or the inner frame 232 and the outer frame 236 may have the same thickness.

Also, in various embodiments, the inner frame 232 and/or the outer frame 236 may form multi-interface frame patterns. A multi-interface frame pattern provides multiple lateral features, created for example by stacked step structures having different widths. The multiple lateral interfaces provide improved selected mode confinement and/or suppression, thus enabling maximization of performance parameters, including Q-factor for frequencies below series resonance frequency Fs and one of parallel resistance Rp at the parallel resonance frequency Fp or series resistance Rs at Fs. When a multi-interface frame pattern has a stacked step structure, the steps have varying (e.g., decreasing) widths, which are either perfectly tuned (meaning that their widths are substantially equal to quarter-wavelength of the main propagating mode at a frequency of interest) or chirped (meaning that their widths do not satisfy a quarter-wavelength condition). Further discussion of multi-interface frame patterns for inner and outer frames is provided, for example, in U.S. Patent Application Publication No. 2013/0063227 (published Mar. 14, 2013) to Burak et al. (issued as U.S. Pat. No. 8,896,395 on Nov. 25, 2014), which is hereby incorporated by reference in its entirety.

The thicknesses of the inner and outer frames 232 and 236 may vary to provide unique benefits for any particular situation or to meet application specific design requirements of various implementations. Generally, application of the inner and outer frames 232 and 236 shifts the resonant frequency ("cut-off frequency") of the active region 112 of the acoustic resonator 200A, and otherwise improves operation, for example, by providing matching of boundary conditions. An increase in thickness of the inner frame 232 causes the resonant frequency of the acoustic resonator 200A to shift lower, and conversely a decrease in the thickness of the inner frame 232 causes the resonant frequency to shift higher. Likewise, an increase in thickness of the outer frame 236 causes the resonant frequency of the acoustic resonator 200A to shift lower, and a decrease in the thickness of the outer frame 236 causes the resonant frequency to shift higher. In an illustrative embodiment, the thickness of the outer frame 236 may be approximately twice the thickness of the inner frame 232. Also, in a non-limiting illustrative configuration, the inner frame 232 may be about 500 Å to about 1000 Å in thickness, and the outer frame 236 may be about 1000 Å to about 3000 Å in thickness, although the various thicknesses and relative thicknesses may vary without departing from the scope of the present teachings.

The gap 234 is arranged between and otherwise defined by the inner and outer frames 232 and 236, and generally varies proportionately to the thickness of the inner frame 232. That is, an increased thickness of the inner frame 232 requires a smaller gap 234. For example, in a non-limiting illustrative configuration, the gap 234 may have a width of about 3 μm to about 8 μm for the illustrative range of the inner frame 232 mentioned above. The arrangement of the inner and outer frames 232 and 236 and the gap 234 are therefore able to improve matching of the boundary acoustical conditions of the acoustic resonator 200A. This modification of the boundary acoustical conditions significantly reduces and/or suppresses excitation of acoustic lateral modes, which results in reduction of the strength of spurious resonances and in improvement of the Q-factor of the acoustic resonator 200A. Thus, for example, the inner frame 232 may be configured to suppress a portion of lateral acoustic waves propagating from the center of the main membrane region 218.

Further discussion of inner and outer frames is provided, for example, in U.S. Pat. No. 8,575,820 (issued Nov. 5, 2013) to Shirakawa et al. (issued as U.S. Pat. No. 7,714,684 on May 11, 2010), which is hereby incorporated by reference in its entirety. In addition, the inner and/or outer frames may composite frames instead of add-on frames. Composite frames may have lateral features integrated into the top electrode 235', such that the top electrode 235' may have a substantially planar top surface. Discussion of integrated frames, such as low or high velocity frames, is provided, for example, in U.S. patent application Ser. No. 13/766,993 (filed Feb. 14, 2013) to Burak et al. (published as U.S. Patent App. Pub. No. 2014/0118092 on May 1, 2014), and U.S. patent application Ser. No. 14/092,026 (filed Nov. 27, 2013) to Burak et al. (published as U.S. Patent App. Pub. No. 2014/0152152 on Jun. 5, 2014), which are hereby incorporated by reference in their entireties.

For example, integrated lateral features of a composite frame may be formed of Al or Mo, and may be formed by embedding different materials within the top electrode 235' (or the bottom electrode 215' discussed below), typically with an exposed upper or lower surface being coplanar with an upper or lower surface of the top electrode 235', respectively. The use of a composite frame(s) may simplify fabrication of the acoustic resonator with regard to application of layers on planar surfaces. For instance, it can prevent formation of outcroppings in overlying layers, which can preserve the structural stability of the acoustic resonator.

Generally speaking, the outer frames suppress electrically excited piston mode in the corresponding outer frame regions, and reflect and otherwise resonantly suppress propagating eigenmodes in lateral directions, with both effects simultaneously improving operation of the acoustic resonator. This is because the presence of outer frames generally produces at least one of a cutoff frequency mismatch and an acoustic impedance mismatch between the frame region and other portions of the active region.

An outer frame that lowers the cutoff frequency in the frame region as compared to the active region may be referred to as a Low Velocity Frame (LVF), while an outer frame that increases the cutoff frequency in the frame region as compared to the active region may be referred to as a High Velocity Frame (HVF). The reasoning behind this nomenclature is that for composite frames (for which thicknesses of the frame and active regions are substantially the same), an increase or decrease of the cutoff frequency is substantially equivalent to an increase or decrease of an effective sound velocity of the acoustic stack forming the frame, respectively.

A composite or add-on frame with lower effective sound velocity than the corresponding effective sound velocity of the active region (i.e., an LVF) generally increases parallel resistance Rp and Q-factor of the acoustic resonator above the cutoff frequency of the active region. Conversely, a composite or add-on frame with a higher effective sound velocity than the corresponding effective sound velocity of the active region (i.e., an HVF) generally decreases series resistance Rs and increases Q-factor of the acoustic resonator below the cutoff frequency of the active region. A typical low velocity frame, for example, effectively provides a region with significantly lower cutoff frequency than the active region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of frames, as well as related materials and operating characteristics, are described in the above cited U.S. patent application Ser. No. 13/663,449 (filed Oct. 29, 2012) to Burak et al. (published as U.S. Patent No. 2014/0118091 on May 1, 2014) and U.S. patent application Ser. No. 13/660,941 (filed Oct. 25, 2012) to Burak et al. (published as U.S. Patent App. Pub. No. 2014/0118088 on May 1, 2014), which are hereby incorporated by reference in their entireties. As explained, frames can be placed in various alternative locations and configurations relative to other portions of an acoustic resonator, such as the top and bottom electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient Kt2.

FIGS. 2B and 2C depict variations of the acoustic resonator 200A with respect to the location of the temperature compensation feature. In particular, acoustic resonator 200B in FIG. 2B is substantially the same as acoustic resonator 200A, except that temperature compensating layer 140 is encapsulated in the bottom electrode (bottom electrode 115'), and acoustic resonator 200C in FIG. 2C is substantially the same as acoustic resonator 200A, except that temperature compensating layer 140 is encapsulated in the piezoelectric layer (piezoelectric layer 125'). In both FIG. 2B and FIG. 2C, air-ring 150 is formed between the piezoelectric layer 125, 125' and the top electrode 235. Further, the top electrode 235 includes the addition of inner frame 232 and outer frame 236 formed its top surface.

Referring to FIG. 2B, in particular, the acoustic resonator 200B comprises substrate 105 defining cavity 110, bottom (first) electrode 115' disposed on the substrate 105 and cavity 110, piezoelectric layer 125 disposed on the bottom electrode 115', top (second) electrode 235 disposed on the piezoelectric layer 125, and passivation layer 165 (optionally) disposed on the top electrode 235. The temperature compensating layer 140 is buried or encapsulated in the bottom electrode 115'. Inner and outer frames 232 and 236 are added on the surface of the top electrode 235, although they may be included as integrated frames where the top electrode 235 is a composite electrode, as discussed above. Collectively, the bottom electrode 115', the piezoelectric layer 125, and the top electrode 235 constitute the acoustic stack of acoustic resonator 200B, and an overlap among the bottom electrode 115', the piezoelectric layer 125 and the top electrode 235 over the cavity 110 provides the active region 112. However, as discussed above, the outer boundaries of the active region 112 are substantially defined by the inner edge of the outer frame 236, and the outer boundaries of the main membrane region 118 are substantially defined by the inner edges of the air-bridge 152 and the air-wing 154, respectively.

Referring to FIG. 2C, the acoustic resonator 200C comprises substrate 105 defining cavity 110, bottom (first) electrode 115 disposed on the substrate 105 and cavity 110, piezoelectric layer 125' disposed on the bottom electrode 115, top (second) electrode 235 disposed on the piezoelectric layer 125', and passivation layer 165 (optionally) disposed on the top electrode 235. The temperature compensating layer 140 is buried or encapsulated in the piezoelectric layer 125' Inner and outer frames 232 and 236 are added on the surface of the top electrode 235, although they may be included as integrated frames where the top electrode 235 is a composite electrode, as discussed above. Collectively, the bottom electrode 115, the piezoelectric layer 125', and the top electrode 235 constitute the acoustic stack of acoustic resonator 200C, and an overlap among the bottom electrode 115, the piezoelectric layer 125' and the top electrode 235 over the cavity 110 provides the active region 112. However, as discussed above, the outer boundaries of the active region 112 are substantially defined by the inner edge of the outer frame 236, and the outer boundaries of the main membrane region 118 are substantially defined by the inner edges of the air-bridge 152 and the air-wing 154, respectively.

In both acoustic resonators 200B and 200C, even though the temperature compensating layer 140 is not in the top electrode 235, which actually defines the air-ring 150 and includes the inner and outer frames 232 and 236, the various predetermined lengths (including the first predetermined length AR of the first section 141a and the second predetermined length TC of the second section 141b) are substantially the same as discussed above with reference to FIG. 2A. That is, an outer edge of the temperature compensating layer 140 is located beyond the inner edge of the air-wing 154 by a predetermined length. Stated differently, the temperature compensating layer 140 extends outside the main membrane region 118 of the acoustic resonator 200B, 200C by the predetermined length. The portion of the temperature compensating layer 140 extending beyond the main membrane region 118 is indicated as end portion 141 of the temperature compensating layer 140. As stated above, the end portion 141 extending beyond the main membrane region 118 includes the first section 141a (indicated by arrow AR) extending from the outer boundary of the main membrane region 118 to the outer edge of the cavity 110 and the second section 141b (indicated by arrow TC) extending from the outer edge of the cavity 110 to the outer edge of the temperature compensating layer 140. The lengths and relative lengths of the first section 141a and the second section 141b, as well as the overall predetermined length of the end portion 141, may be adjusted to optimize various operational parameters of the acoustic resonators 200B, 200C, as discussed above.

Figure 3A:
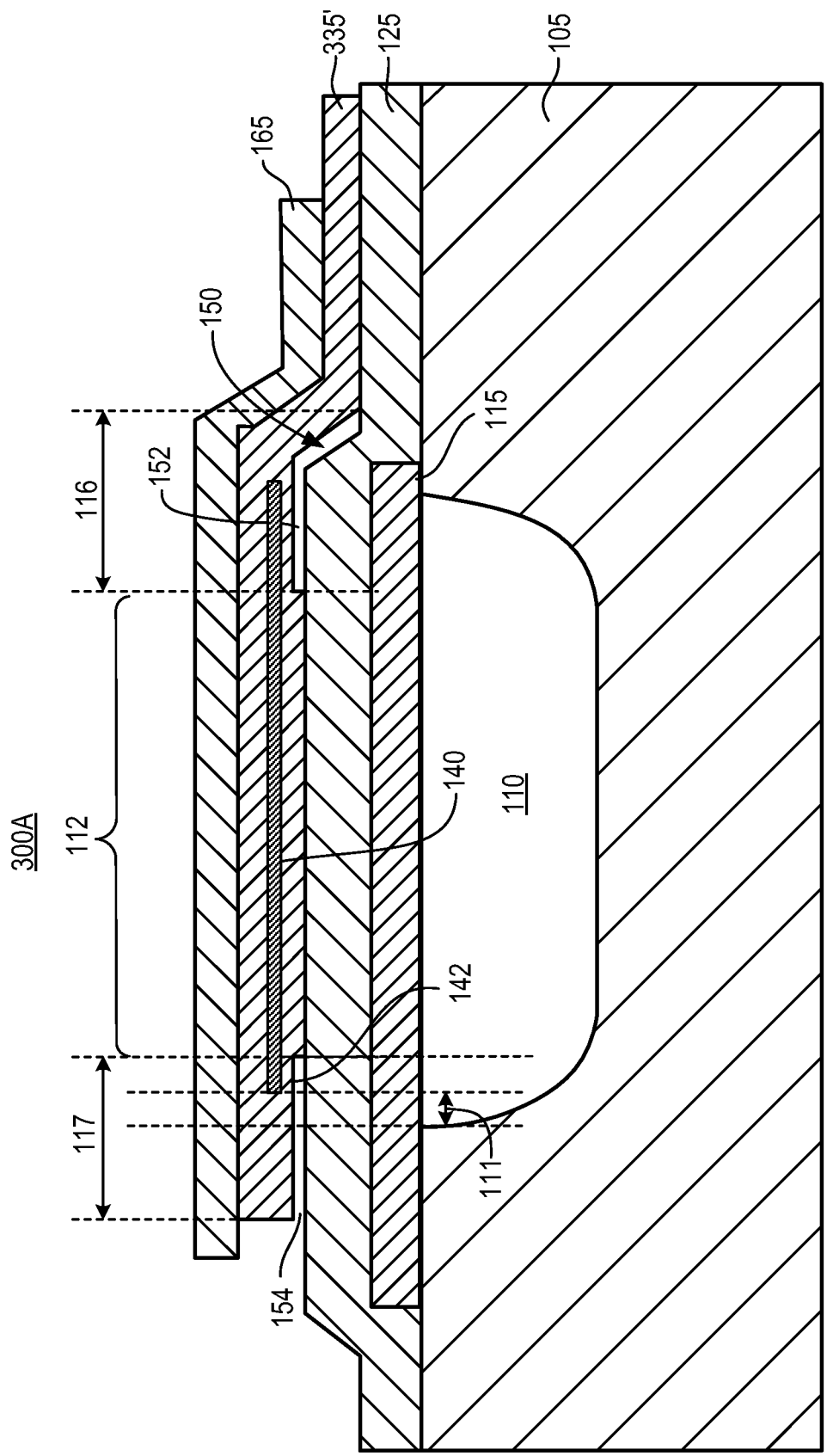
FIG. 3A is a cross-sectional view of an acoustic resonator having a temperature compensating layer, according to a representative embodiment.
Figure 3B:
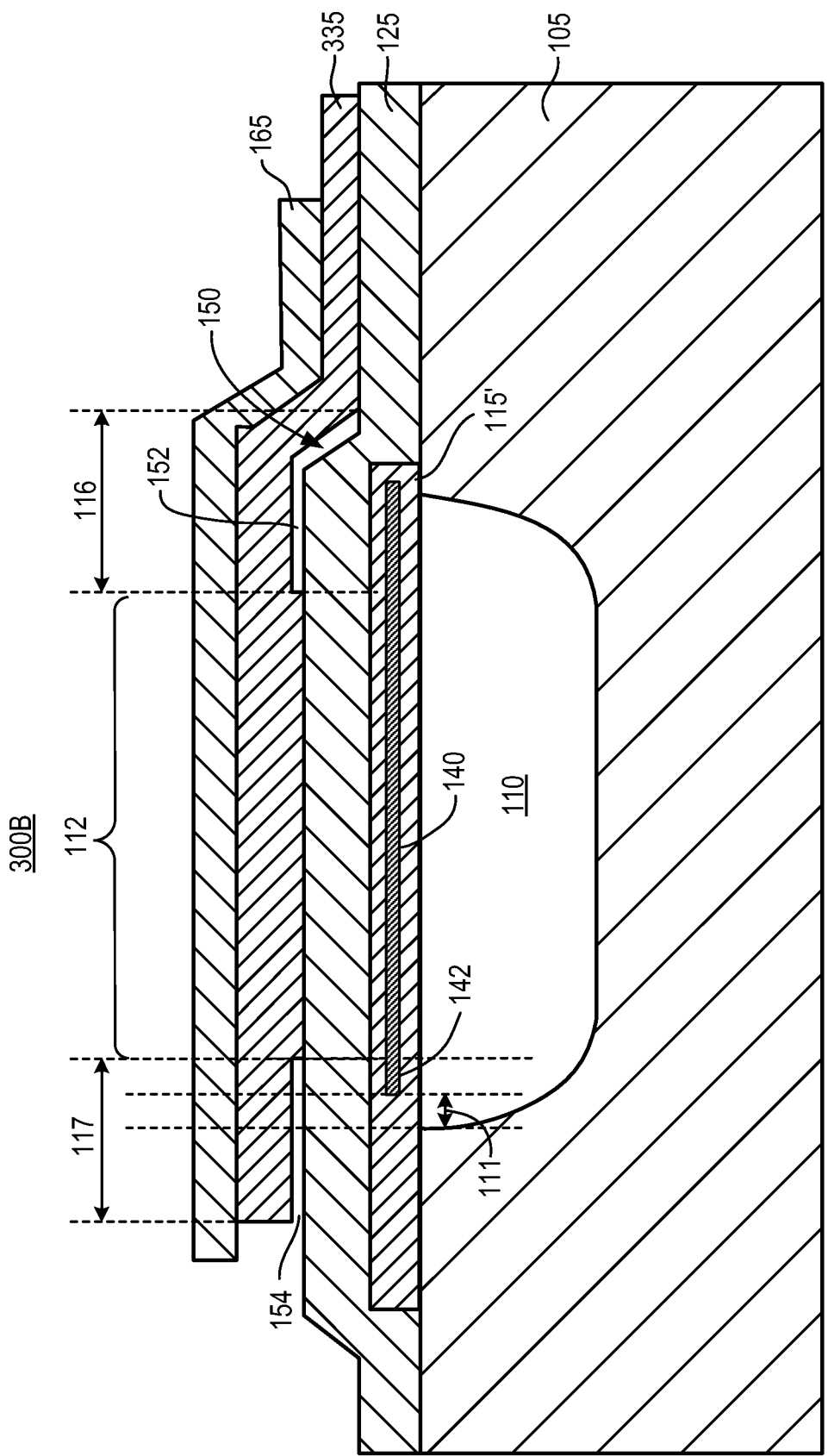
FIG. 3B is a cross-sectional view of an acoustic resonator having a temperature compensating layer, according to a representative embodiment.
Figure 3C:
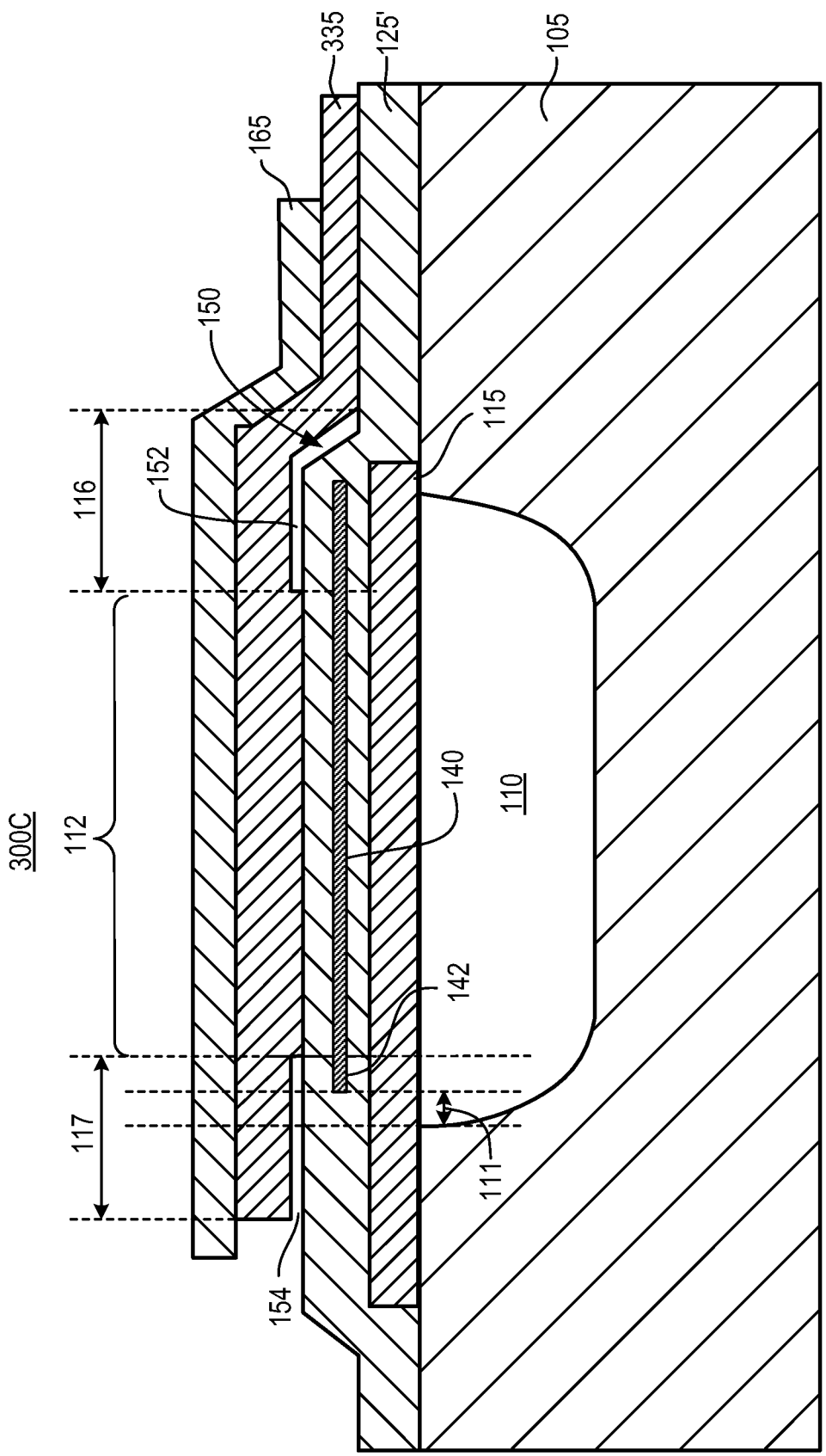
FIG. 3C is a cross-sectional view of an acoustic resonator having a temperature compensating layer, according to a representative embodiment.

FIGS. 3A-3C are cross-sectional diagrams illustrating acoustic resonators having a temperature compensating layer, according to representative embodiments.

Referring to FIG. 3A, acoustic resonator 300A is similar to acoustic resonator 100B, except that temperature compensating layer 140, which extends beyond an active region of the acoustic resonator 300A, ends within the outer boundaries of cavity 110 formed in substrate 105. Therefore, the acoustic resonator 300A (e.g., an FBAR) comprises a substrate 105 defining a cavity 110, a bottom (first) electrode 115 disposed on the substrate 105 and cavity 110, a piezoelectric layer 125 disposed on the bottom electrode 115, and top (second) electrode 335' disposed on the piezoelectric layer 125. Collectively, the bottom electrode 115, the piezoelectric layer 125, and the top electrode 335' constitute an acoustic stack of acoustic resonator 300A. An overlap among the bottom electrode 115, the piezoelectric layer 125 and the top electrode 335' over the air cavity 110 provides an active region 312 of the acoustic resonator 300A. A passivation layer 165 (optional) is disposed top of top electrode 235' with thickness sufficient to insulate all layers of the acoustic stack from the environment, including protection from moisture, corrosives, contaminants, debris and the like.

A top air-ring 150 is formed between the piezoelectric layer 125 and the top electrode 335'. As discussed above, the top air-ring 150 extends along all or a portion of the perimeter of the acoustic resonator 300A, and comprises air-bridge 152 on the connection side of the top electrode 335' and air-wing 154 along the remaining outside perimeter. The inner edges of the air-ring 150 (i.e., the respective inner edges of the air-bridge 152 and the air-wing 154) may substantially define an outer boundary of the active region 112 of the acoustic resonator 300A.

In the depicted embodiment, the temperature compensating layer 140 is buried or encapsulated in the top electrode 335', as discussed above with reference to FIG. 1B. An outer edge of the temperature compensating layer 140 is located beyond the inner edge of the air-wing 154 by a predetermined length. Stated differently, the temperature compensating layer 140 extends outside the active region 112 of the acoustic resonator 300A by the predetermined length. The portion of the temperature compensating layer 140 extending beyond the active region 112 is indicated as end portion 142 of the temperature compensating layer 140. However, unlike previous embodiment described herein, the end portion 142 ends within the outer boundaries of the cavity 110. The remaining length to the edge of the cavity 110 is indicated by extended cavity section 111. The lengths of the end portion 142 and the extended cavity section 111 may be adjusted to optimize various operational parameters of the acoustic resonator 300A, such as maximizing at least one of a Q-factor value and a parallel resistance Rp value of the acoustic resonator 300A. The optimized length of the end portion 142 and the extended cavity section 111 for improvement of the Q-factor and/or the parallel resistance Rp is about the same, e.g. about 1 μm.

FIGS. 3B and 3C depict variations of the acoustic resonator 300A with respect to the location of the temperature compensation feature. In particular, acoustic resonator 300B in FIG. 3B is substantially the same as acoustic resonator 300A, except that temperature compensating layer 140 is encapsulated in the bottom electrode (bottom electrode 115'), and acoustic resonator 300C in FIG. 3C is substantially the same as acoustic resonator 300A, except that temperature compensating layer 140 is encapsulated in the piezoelectric layer (piezoelectric layer 125'). In both FIG. 3B and FIG. 3C, air-ring 150 is formed between the piezoelectric layer 125, 125' and the top electrode 335. Further, in alternative embodiments of the acoustic resonators shown in FIGS. 3A-3C, the top electrode 335, 335' may include inner and/or outer frames, as discussed above with reference to FIGS. 2A-2C.

Referring to FIG. 3B, in particular, the acoustic resonator 300B comprises substrate 105 defining cavity 110, bottom (first) electrode 115' disposed on the substrate 105 and cavity 110, piezoelectric layer 125 disposed on the bottom electrode 115', top (second) electrode 335 disposed on the piezoelectric layer 125, and passivation layer 165 (optionally) disposed on the top electrode 335. The temperature compensating layer 140 is buried or encapsulated in the bottom electrode 115'. Collectively, the bottom electrode 115', the piezoelectric layer 125, and the top electrode 235 constitute the acoustic stack of acoustic resonator 200B, and an overlap among the bottom electrode 115', the piezoelectric layer 125 and the top electrode 335 over the cavity 110 provides the active region 112. However, as discussed above, the outer boundaries of the active region 112 are substantially defined by the inner edges of the air-bridge 152 and the air-wing 154, respectively.

Referring to FIG. 2C, the acoustic resonator 300C comprises substrate 105 defining cavity 110, bottom (first) electrode 115 disposed on the substrate 105 and cavity 110, piezoelectric layer 125' disposed on the bottom electrode 115, top (second) electrode 335 disposed on the piezoelectric layer 125', and passivation layer 165 (optionally) disposed on the top electrode 335. The temperature compensating layer 140 is buried or encapsulated in the piezoelectric layer 125'. Collectively, the bottom electrode 115, the piezoelectric layer 125', and the top electrode 335 constitute the acoustic stack of acoustic resonator 300C, and an overlap among the bottom electrode 115, the piezoelectric layer 125' and the top electrode 335 over the cavity 110 provides the active region 112. However, as discussed above, the outer boundaries of the active region 112 are substantially defined by the inner edges of the air-bridge 152 and the air-wing 154, respectively.

In both acoustic resonators 300B and 300C, even though the temperature compensating layer 140 is not in the top electrode 335, which actually defines the air-ring 150, the various predetermined lengths (including the lengths of the end portion 142 of the temperature compensating layer 140 and the extended cavity section 111) are substantially the same as discussed above with reference to FIG. 2A.

Figure 4:
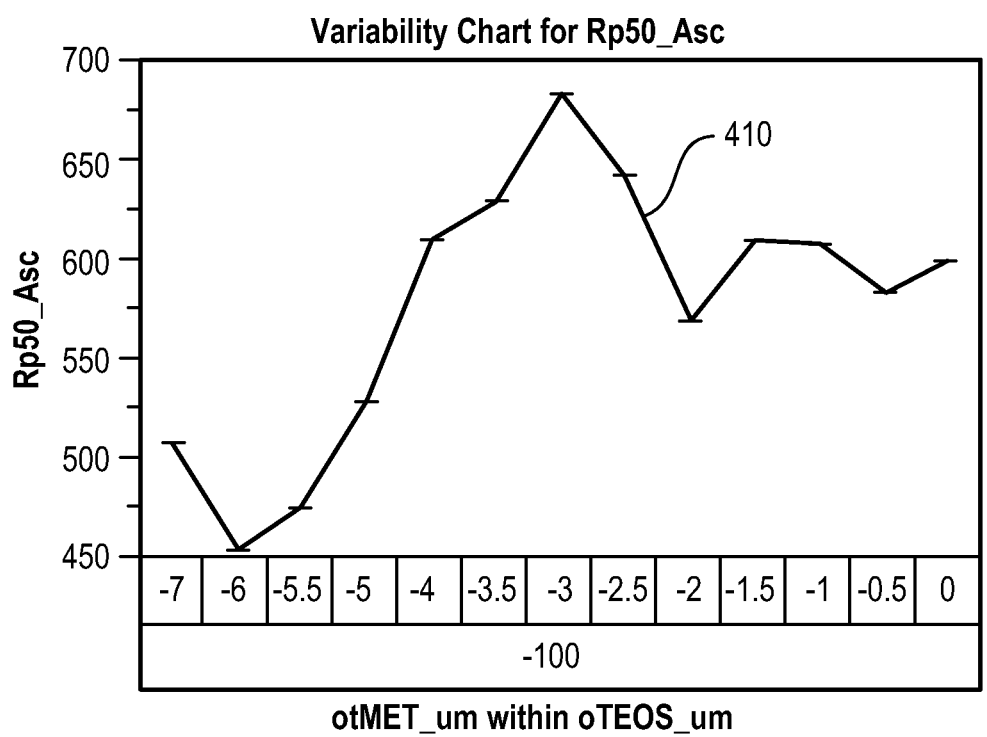
FIG. 4 is a graph depicting parallel resistance Rp values as a function of an amount a temperature compensating layer extends into a substrate cavity, according to a representative embodiment.

FIG. 4 is a graph depicting parallel resistance Rp values as a function of an amount the edge of the top electrode (containing a temperature compensating layer) extends into a substrate cavity, according to a representative embodiment.

The graph is based on a representative numerical simulation of the embodiment shown in FIG. 1B, where the edge of the top electrode 135', which corresponds to the inner edge of the air-wing 154, extends into the cavity 110 (indicated by length AR in FIG. 1B). The horizontal axis shows this amount in micrometers, where "0" represents alignment of the inner edge of the air-wing 154 with the outer edge of the cavity 110. The vertical axis shows the corresponding parallel resistance Rp (in arbitrary units).

In the depicted example, the bottom electrode 115 is formed of Mo having thickness of about 3.3 kÅ, the piezoelectric layer 125 is formed of AlN having thickness of about 9.3 kÅ, the top electrode 135' is formed of Mo having thickness of about 3.25 kÅ, the temperature compensating layer 140 is formed of TEOS having thickness of about 0.5 kÅ, and the passivation layer 165 is formed of AlN having thickness of about 2 kA. Under these parameters, trace 410 indicates that the best parallel resistance Rp is obtained when the air-wing 154 extends into the cavity 110 by approximately 3.25 μm. Notably, trace 410 also indicates a 3.0 μm half-period (6.0 μm period), suggesting that the cTE wave outside of the edge of the top electrode 135' (i.e., the inner edge of the air-wing 154) has approximately 0.15 l/μm real part of its eigen-wave number. Presumably, the edge of the top electrode 135' emits cTE mode that propagates to the outer edge of the cavity 110, and is reflected from there. A standing wave condition outside of top electrode 135' may either suppress (peaks of trace 410) or enhance (troughs of trace 410) this mode. For smaller distances (e.g., less than 3.0 μm), higher order complex and/or evanescent modes may interfere with this behavior.

Although the above description presents several embodiments in the form of FBAR devices, several of the described concepts could be implemented in other forms of acoustic resonators, such as SMRs, for example, in which an encapsulated temperature compensating layer extends beyond an active region of the respective acoustic resonator.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator device, comprising:
    a substrate;
    a bottom electrode formed over the substrate;
    a piezoelectric layer formed on the bottom electrode;
    a top electrode formed on the piezoelectric layer;
    an air-wing and an air-bridge formed between the piezoelectric layer and the top electrode, the air-wing having an inner edge that defines an outer boundary of an active region of the BAW resonator device; and
    a temperature compensation feature having a positive temperature coefficient for offsetting at least a portion of a negative temperature coefficient of the piezoelectric layer, the temperature compensation feature located in one of the top electrode, the piezoelectric layer or the bottom electrode,
    wherein the temperature compensation feature extends outside the active region by a predetermined length.

2. The BAW resonator device of claim 1, wherein the temperature compensation feature comprises a temperature compensating layer buried in the top electrode, and
    wherein an outer edge of the temperature compensating layer is located beyond the inner edge of the air-wing by the predetermined length.

3. The BAW resonator device of claim 2, wherein the outer edge of the temperature compensating layer buried in the top electrode is located within an outer edge of a cavity formed in the substrate.

4. The BAW resonator device of claim 1, wherein the temperature compensation feature comprises a temperature compensating layer buried in the piezoelectric layer, and
    wherein an outer edge of the temperature compensating layer is located beyond the inner edge of the air-wing by the predetermined length.

5. The BAW resonator device of claim 4, wherein the outer edge of the temperature compensating layer buried in the piezoelectric layer is located within an outer edge of a cavity formed in the substrate.

6. The BAW resonator device of claim 1, wherein the temperature compensation feature comprises a temperature compensating layer buried in the bottom electrode, and
    wherein an outer edge of the temperature compensating layer is located beyond the inner edge of the air-wing by the predetermined length.

7. The BAW resonator device of claim 1, wherein the predetermined length of the temperature compensation feature that extends outside the active region is optimized to maximize at least one of a quality factor (Q) value and a parallel resistance (Rp) value of the BAW resonator device.

8. The BAW resonator device of claim 1, wherein at least one of the bottom electrode and the top electrode comprises a composite electrode having an integrated lateral feature.

9. The BAW resonator device of claim 8, wherein the temperature compensation feature comprises a temperature compensating layer in the at least one of the bottom electrode and the top electrode comprising the composite electrode having the integrated lateral feature.

10. The BAW resonator device of claim 1, wherein the inner edge of the air-wing extends into a cavity, formed in the substrate, by a first predetermined length, and the temperature compensation feature extends past an outer edge of the cavity by a second predetermined length, such that the predetermined length of the temperature compensation feature that extends outside the active region is the sum of the first and second predetermined lengths.

11. The BAW resonator device of claim 10, wherein the first and second predetermined lengths are optimized to maximize at least one of a quality factor (Q) value and a parallel resistance (Rp) value of the BAW resonator device.

12. The BAW resonator device of claim 11, wherein the first predetermined length by which the inner edge of the air-wing extends into the cavity is approximately 2 µm or greater, and the second predetermined length by which the temperature compensation feature extends past the outer edge of the cavity is greater than or equal to approximately 2 µm.

13. A bulk acoustic wave (BAW) resonator device, comprising:
    a substrate;
    a bottom electrode formed over the substrate;
    a piezoelectric layer formed on the bottom electrode;
    a top electrode formed on the piezoelectric layer;
    an air-wing and an air-bridge formed between the piezoelectric layer and the top electrode, the air-wing having an inner edge that defines an outer boundary of an active region of the BAW resonator device; and
    a temperature compensation feature having a positive temperature coefficient for offsetting at least a portion of a negative temperature coefficient of the piezoelectric layer,
    wherein the temperature compensation feature extends outside the active region by a predetermined length,
    wherein the temperature compensation feature comprises a temperature compensating layer located between the bottom electrode and the piezoelectric layer, and
    wherein an outer edge of the temperature compensating layer is located beyond the inner edge of the air-wing by the predetermined length.

14. A bulk acoustic wave (BAW) resonator device, comprising:
    a substrate defining a cavity;
    a bottom electrode formed over the substrate and at least a portion of the cavity;
    a piezoelectric layer formed on the bottom electrode;
    a top electrode formed on the piezoelectric layer;
    an outer frame formed on or in the top electrode, the outer frame having an inner edge that defines an outer boundary of an active region of the BAW resonator device;
    an air-wing and an air-bridge formed between the piezoelectric layer and the top electrode; and
    a temperature compensation feature having a positive temperature coefficient for offsetting at least a portion of a negative temperature coefficient of at least the piezoelectric layer,
    wherein the temperature compensation feature extends outside the active region by a predetermined length.

15. The BAW resonator device of claim 14, wherein an inner edge of the air-wing defines an outer boundary of a main membrane region containing the active region, and
    wherein the temperature compensation feature extends past the inner edge of the air-wing by the predetermined length.

16. The BAW resonator device of claim 14, further comprising:
    an inner frame formed on or in the top electrode within an area at least partially surrounded by the outer frame, the inner frame being configured to suppress a portion of lateral acoustic waves propagating from a center of the active region.

17. The BAW resonator device of claim 16, wherein a thickness of the outer frame is greater than a thickness of the inner frame.

18. The BAW resonator device of claim 14, wherein the temperature compensation feature comprises a temperature compensating layer in one of the bottom electrode, the piezoelectric layer, or the top electrode.

19. The BAW resonator device of claim 18 wherein the temperature compensating layer is formed of tetraethyl orthosilicate (TEOS), silicon dioxide ($SiO_2$) or boron-doped silicon oxide (BSG).

20. The BAW resonator device of claim 19, wherein the piezoelectric layer comprises a piezoelectric material doped with at least one rare earth element, the at least one rare earth element off-setting at least a portion of degradation in a coupling coefficient $Kt^2$ of the BAW resonator device caused by the temperature compensating layer.

* * * * *